United States Patent
Pao et al.

(10) Patent No.: US 10,187,988 B1
(45) Date of Patent: Jan. 22, 2019

(54) ADAPTER WITH AN INSULATING BODY HAVING A CIRCUIT BOARD WITH A PLURALITY OF CONDUCTIVE MODULES SURFACE MOUNTED ON THE BOARD

(71) Applicant: CHIEF LAND ELECTRONIC CO., LTD., New Taipei (TW)

(72) Inventors: Chung-Nan Pao, New Taipei (TW); Chia-Feng Huang, New Taipei (TW); Sun-Yu Chou, New Taipei (TW)

(73) Assignee: CHIEF LAND ELECTRONIC CO., LTD., New Taipei (TW)

( * ) Notice: Subject to any disclaimer, the term of this patent is extended or adjusted under 35 U.S.C. 154(b) by 0 days.

(21) Appl. No.: 15/810,110

(22) Filed: Nov. 12, 2017

(30) Foreign Application Priority Data

Aug. 14, 2017 (TW) .............................. 106127467 A (51) Int. Cl.
| | | |
|---|---|---|
| *H01R 33/00* | (2006.01) | |
| *H05K 1/14* | (2006.01) | |
| *H01R 12/71* | (2011.01) | |
| *H05K 1/18* | (2006.01) | |
| *H01R 33/88* | (2006.01) | |

(52) U.S. Cl.
CPC ........... *H05K 1/141* (2013.01); *H01R 12/718* (2013.01); *H01R 33/88* (2013.01); *H05K 1/181* (2013.01); *H05K 2201/1059* (2013.01); *H05K 2201/10318* (2013.01); *H05K 2201/10772* (2013.01)

(58) Field of Classification Search
CPC ...... H01R 12/718; H01R 25/00; H01R 31/06; H01R 33/88; H01R 33/94
USPC .................................. 439/620.01, 300, 638
See application file for complete search history.

(56) References Cited

U.S. PATENT DOCUMENTS

| | | | | |
|---|---|---|---|---|
| 5,037,316 A | * | 8/1991 | Fukushima | .......... H05K 3/3426 439/79 |
| 7,338,325 B2 | * | 3/2008 | Yin | ....................... H01R 31/065 439/638 |
| 2008/0214055 A1 | * | 9/2008 | Gulla | ................. H01R 13/6587 439/638 |
| 2010/0227509 A1 | * | 9/2010 | He | ......................... H01R 27/00 439/638 |
| 2012/0009824 A1 | * | 1/2012 | Sasaki | .................. H01R 12/724 439/638 |
| 2012/0231675 A1 | * | 9/2012 | Zhang | .................. H01R 12/724 439/682 |
| 2013/0157514 A1 | * | 6/2013 | Long | .................... G02B 6/0001 439/638 |

(Continued)

*Primary Examiner* — Chandrika Prasad
(74) *Attorney, Agent, or Firm* — Li & Cai Intellectual Property (USA) Office (57) ABSTRACT

An adapter includes an insulating body, a circuit board, and a plurality of conductive modules. The circuit board is arranged in the insulating body and has two opposite surfaces. The conductive modules are arranged in the insulating body and are respectively disposed on two opposite ends of at least one of the two surfaces of the circuit board. Each of the conductive modules includes a plastic member and a plurality of conductive terminals arranged in one row. Each of the conductive terminals has an embedded segment embedded in the plastic member, a fixing segment extending from an end of the embedded segment and soldered on the circuit board by using a SMT manner, and a contacting segment extending from an opposite end of the embedded segment in a direction away from the circuit board.

16 Claims, 11 Drawing Sheets

(56) References Cited

U.S. PATENT DOCUMENTS

| | | | |
|---|---|---|---|
| 2015/0079842 A1* | 3/2015 | Pao .................. | H01R 13/648 |
| | | | 439/607.05 |
| 2015/0111433 A1* | 4/2015 | Hou .................. | H01R 12/707 |
| | | | 439/626 |
| 2015/0270646 A1* | 9/2015 | Kao .................. | H01R 13/6581 |
| | | | 439/76.1 |
| 2016/0043511 A1* | 2/2016 | Hsu .................. | H01R 13/6585 |
| | | | 439/607.05 |
| 2017/0070013 A1* | 3/2017 | Hsu .................. | H01R 24/60 |
| 2017/0271822 A1* | 9/2017 | Zhang ............... | H01R 12/7082 |

* cited by examiner

ADAPTER WITH AN INSULATING BODY HAVING A CIRCUIT BOARD WITH A PLURALITY OF CONDUCTIVE MODULES SURFACE MOUNTED ON THE BOARD

BACKGROUND OF THE INVENTION

1. Field of the Invention

The present disclosure relates to an adapter assembly and an adapter; in particular, to an adapter assembly and an adapter each provided with a plurality of conductive modules, which are formed by using an insert molding manner.

2. Description of Related Art

The signal transmission between two cable connectors is implemented by using an external circuit board and two adapters separately mounted on the external circuit board. Specifically, the two adapters are electrically connected to each other through the external circuit board, so that the two cable connectors can transmit signal to each other by respectively inserting into the two adapters. However, the signal transmission function of the conventional adapter is implemented by soldering the conventional adapter on the external circuit board, so that the development of the conventional adapter is subjected thereto.

SUMMARY OF THE INVENTION

The present disclosure provides an adapter assembly and an adapter to effectively improve the drawbacks associated with conventional adapters.

The present disclosure discloses an adapter assembly, which includes a plurality of adapters arranged in one row. Each of the adapters includes an insulating body, two circuit boards, and a plurality of conductive modules. The insulating body includes an internal connecting portion and an external connecting portion connected to the internal connecting portion. The two circuit boards are separately arranged in the insulating body. The conductive modules are arranged in the insulating body and respectively disposed on two opposite sides of the two circuit boards. Each of the conductive modules includes a plastic member and a plurality of conductive terminals arranged in one row. Each of the conductive terminals has an embedded segment embedded in the plastic member, a fixing segment extending from an end of the embedded segment, and a contacting segment extending from an opposite end of the embedded segment. In each of the adapters, the fixing segments of the conductive modules are soldered on the two circuit boards by using a surface mounting technology (SMT) manner. The internal connecting portions of the adapters are connected to each other to form as one piece.

The present disclosure further discloses an adapter, which includes an insulating body, a circuit board, and a plurality of conductive modules. The circuit board is arranged in the insulating body and has two opposite surfaces. The conductive modules are arranged in the insulating body and are respectively disposed on two opposite ends of at least one of the two surfaces of the circuit board. Each of the conductive modules includes a plastic member and a plurality of conductive terminals arranged in one row. Each of the conductive terminals has an embedded segment embedded in the plastic member, a fixing segment extending from an end of the embedded segment and soldered on the circuit board by using a SMT manner, and a contacting segment extending from an opposite end of the embedded segment in a direction away from the circuit board.

In summary, for the adapter assembly of the present disclosure, the inner structure of each of the adapters is formed by soldering the conductive modules onto the circuit board, and each of the conductive modules is formed by the conductive terminals embedded in the plastic member through insert molding and soldered onto the circuit board through surface mounting technology (SMT), so that the adapter with lower production cost can be produced quickly.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE PREFERRED EMBODIMENTS

Reference is made to FIGS. 1 to 11, which illustrate an embodiment of the present disclosure. References are hereunder made to the detailed descriptions and appended drawings in connection with the present disclosure. However, the appended drawings are merely provided for exemplary purposes, and should not be construed as restricting the scope of the present disclosure.

Figure 1:
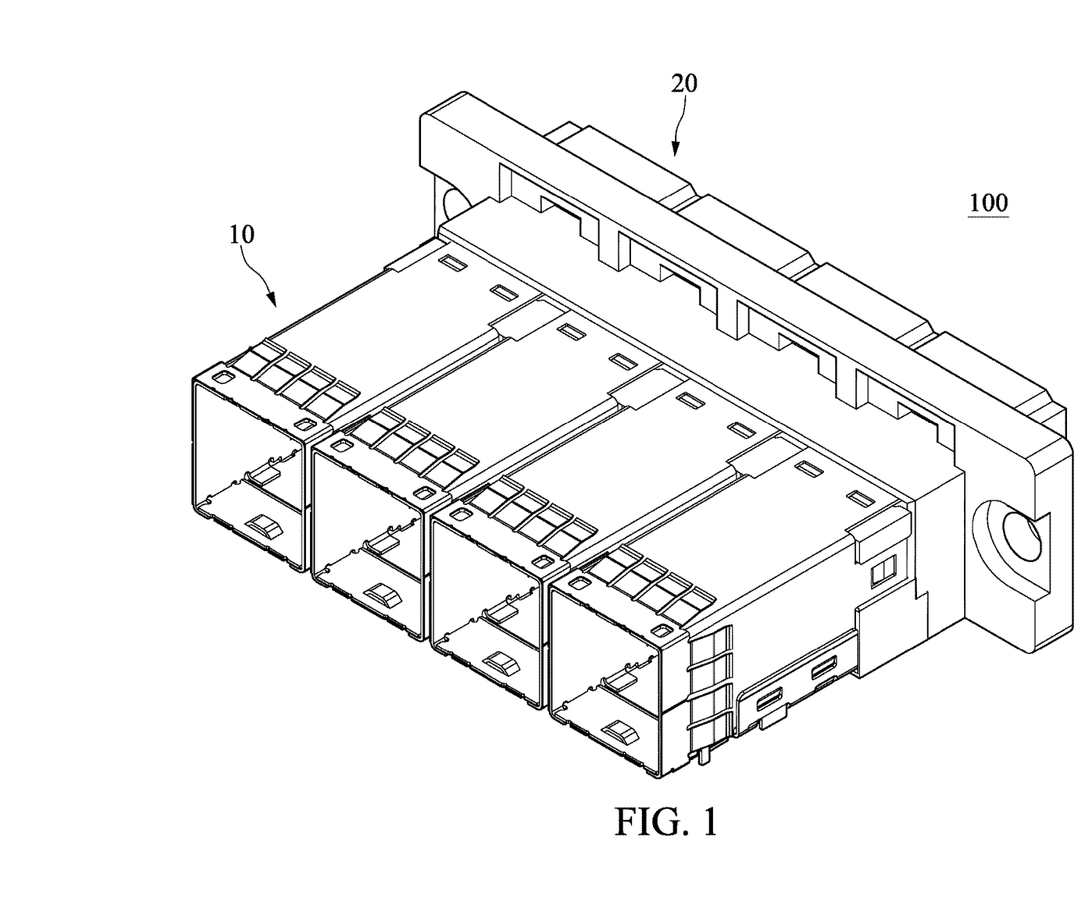
FIG. 1 is a perspective view showing a signal transferring device according to an embodiment of the present disclosure.
Figure 2:
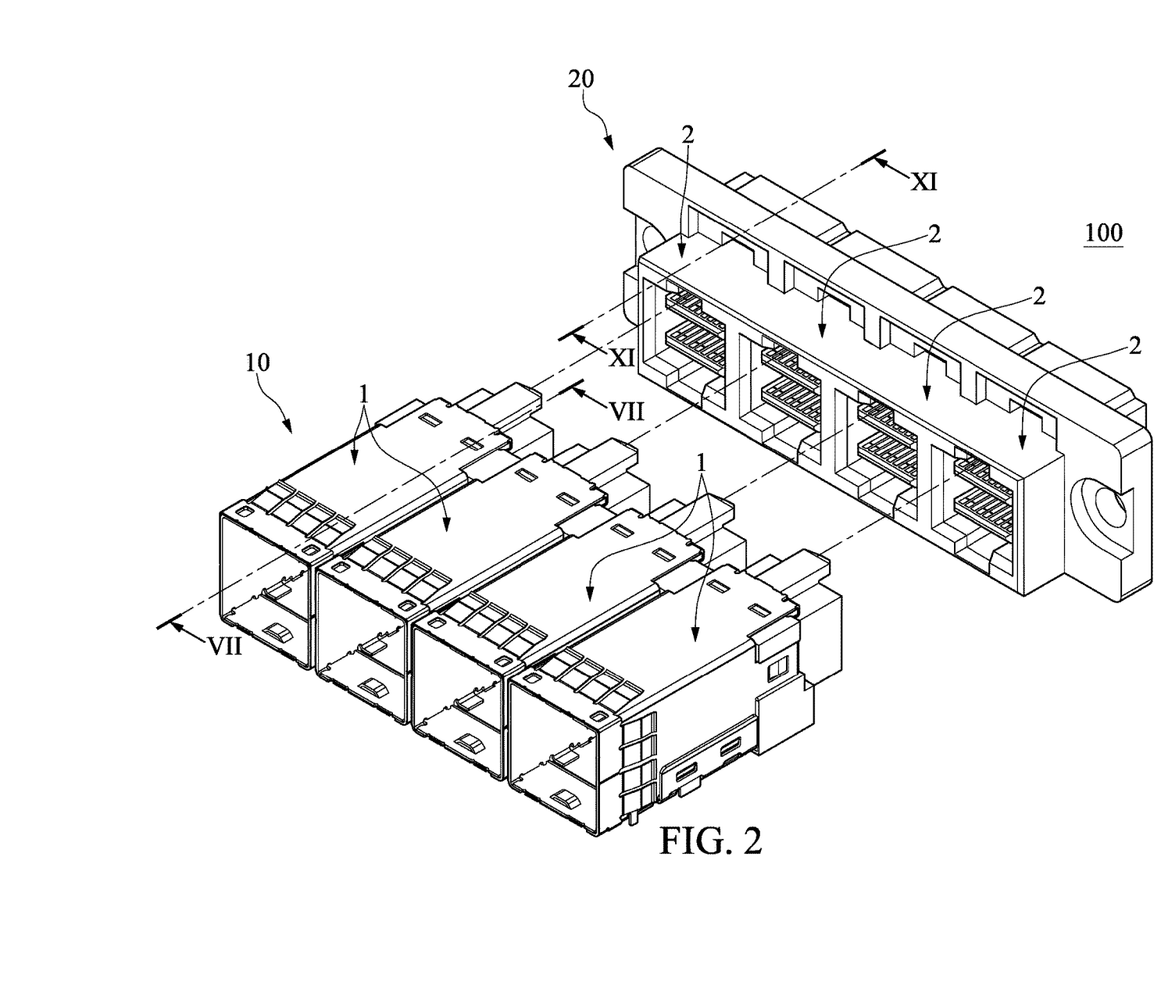
FIG. 2 is an exploded view of FIG. 1.
Figure 3:
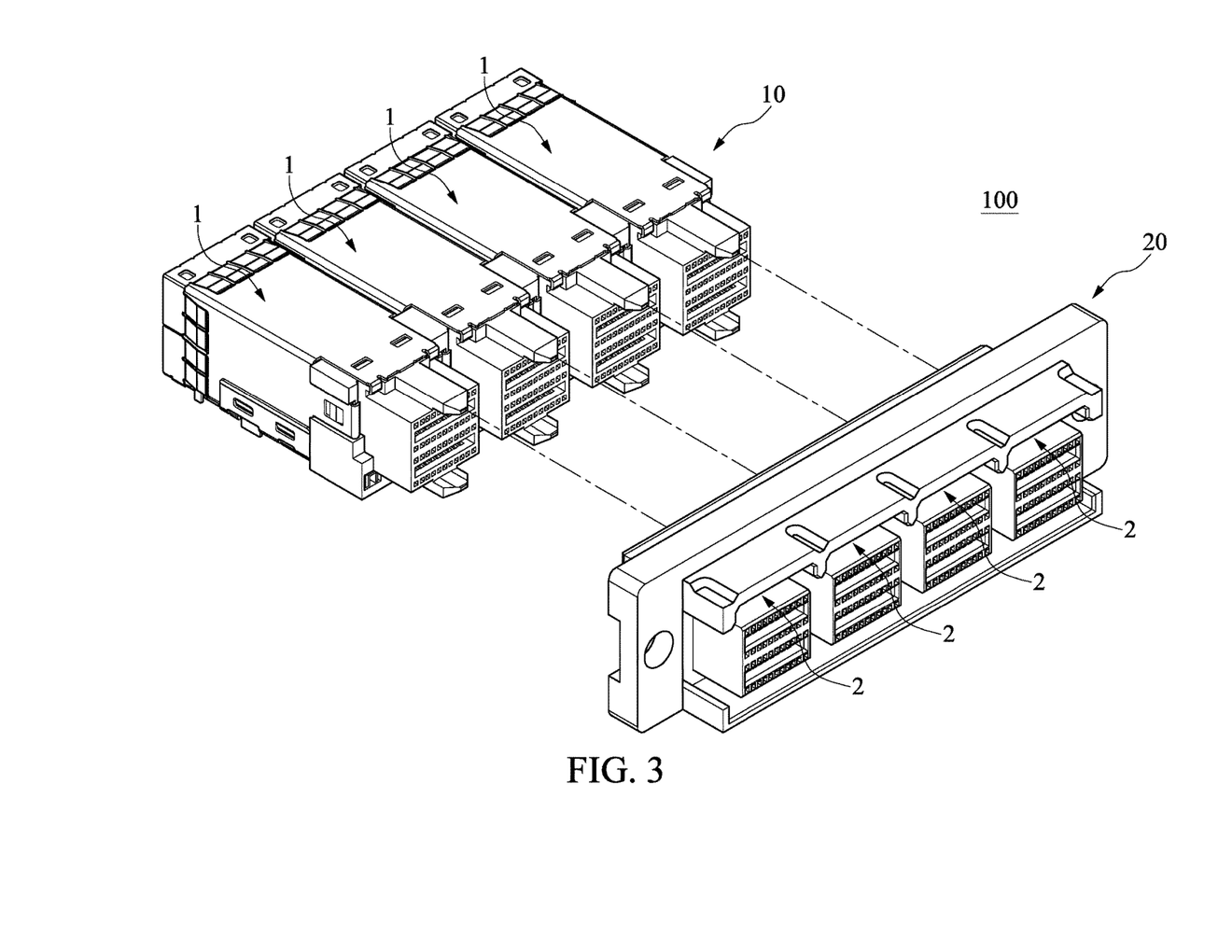
FIG. 3 is an exploded view of FIG. 1 from another perspective.

Reference is first made to FIGS. 1 to 3, which illustrate a signal transferring device 100 of the present embodiment. The signal transferring device 100 includes a first adapter assembly 10 and a second adapter assembly 20 detachably inserted into the first adapter assembly 10. The first adapter assembly 10 is configured for accommodating and electrically connecting to a plurality of first cable connectors (i.e., external Mini-SAS HD cable connectors), and the second adapter assembly 20 is configured for accommodating and electrically connecting to a plurality of second cable connectors (i.e., internal Mini-SAS HD cable connectors), so that the first cable connectors can be respectively and electrically connected to the second cable connectors by inserting the first adapter assembly 10 into the second adapter assembly 20. Accordingly, the first cable connectors can be electrically isolated from the second cable connectors by separating the first adapter assembly 10 from the second adapter assembly 20, such that the first cable connectors and the second cable connectors can be still preserved into the first adapter assembly 10 and the second adapter assembly 20, thereby preventing a repeated insertion endangering the first and second cable connectors.

It should be noted that the first adapter assembly 10 and the corresponding components in the present embodiment each use the term "first" to distinguish from the second adapter assembly 20 and the corresponding components, but the term "first" does not have any physical meaning. That is to say, the terms "first" and "second" in the present embodiment can be omitted.

Figure 4:
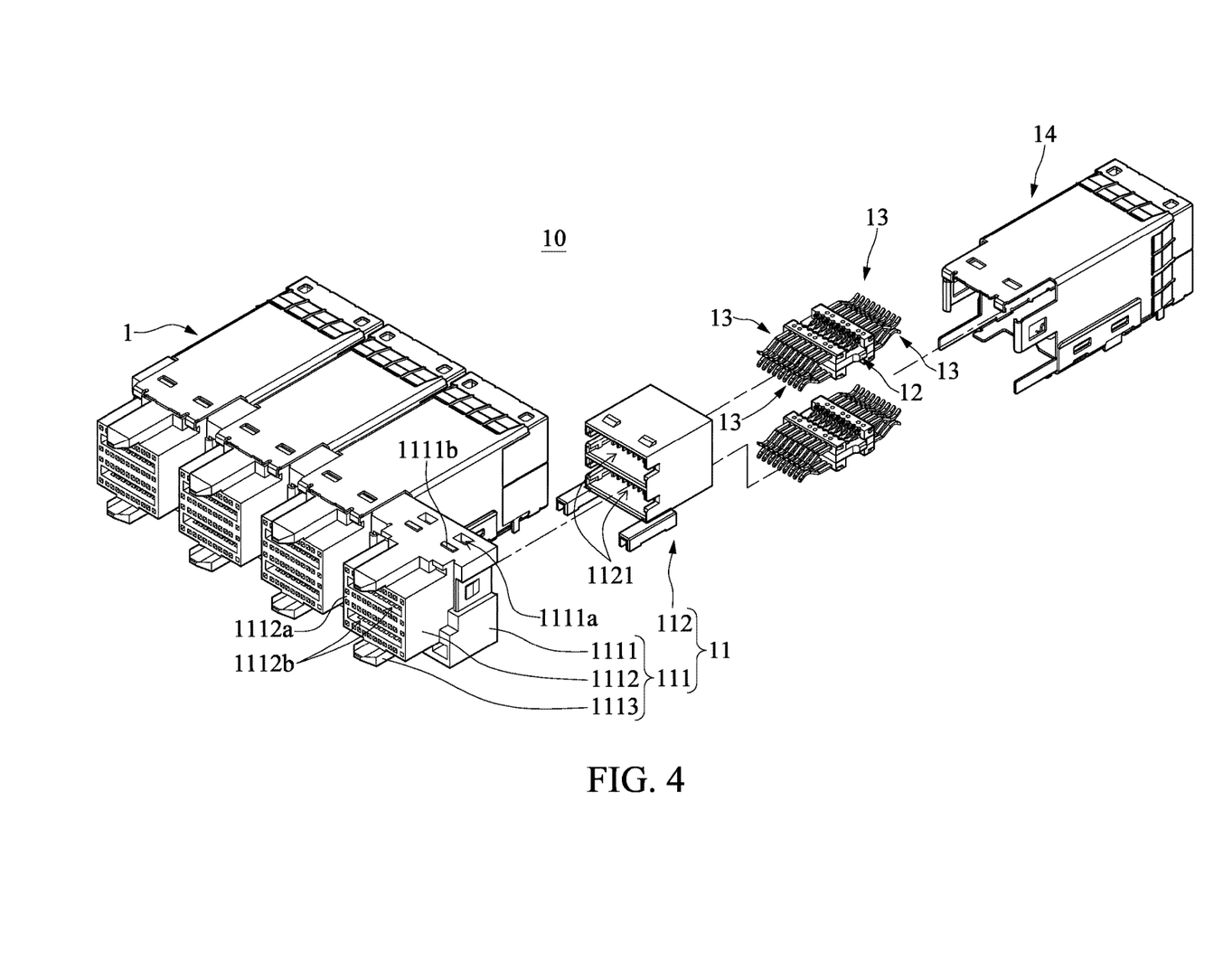
FIG. 4 is an exploded view showing a first adapter assembly of the embodiment.
Figure 5:
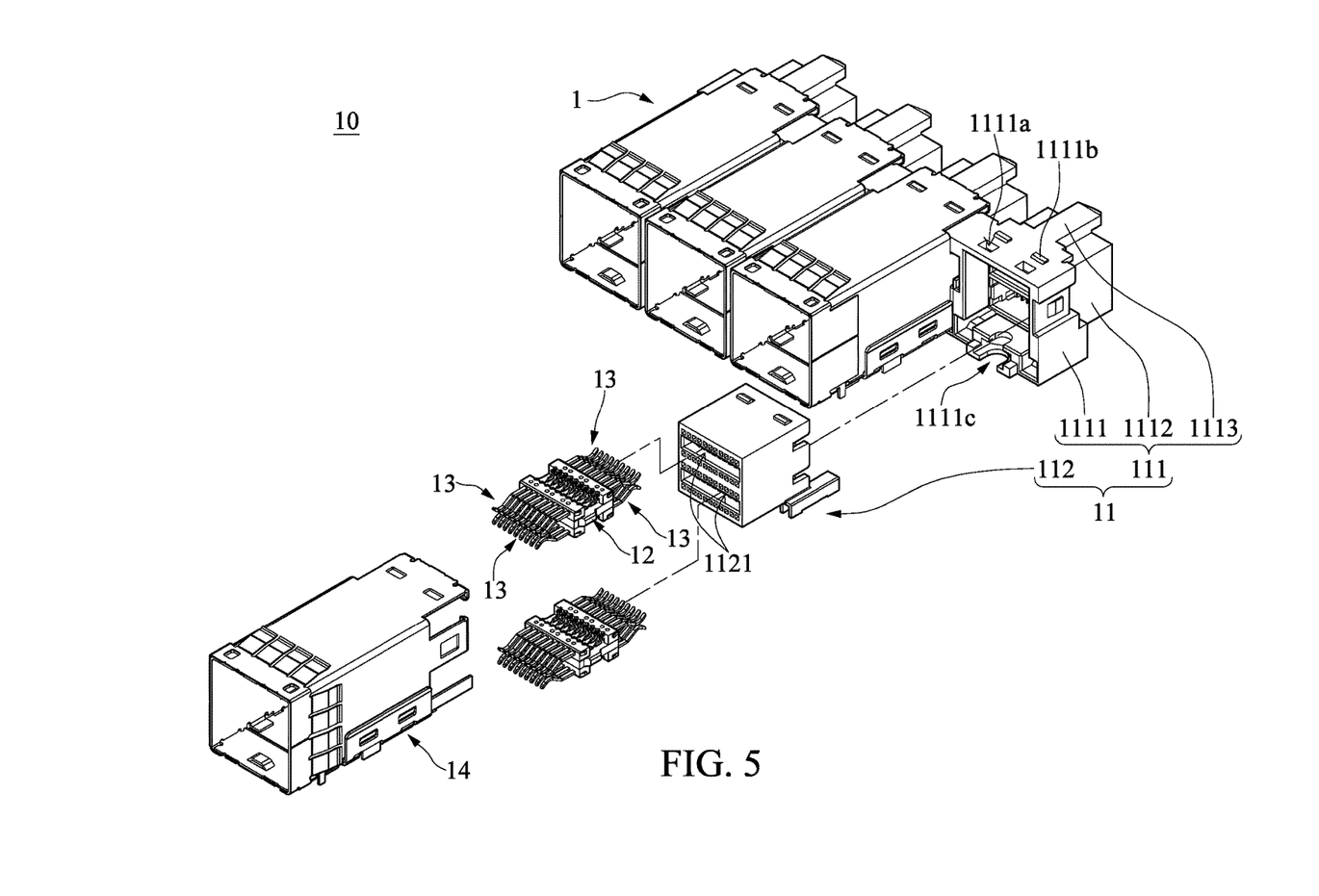
FIG. 5 is an exploded view showing the first adapter assembly of the embodiment from another perspective.

As shown in FIGS. 4 and 5, the first adapter assembly 10 includes a plurality of first adapters 1 arranged in one row. Each of the first adapters 1 has two first electrical connection interfaces respectively arranged on two opposite sides thereof. That is to say, the two opposite sides of each of the first adapters 1 have the same electrical connection interface. As the first adapters 1 are of the same structure, the following description only discloses the structure of one of the first adapters 1 for the sake of brevity.

The first adapter 1 includes a first insulating body 11, two circuit boards 12 separately arranged in the first insulating body 11, a plurality of first conductive modules 13 arranged in the first insulating body 11 and respectively disposed on the two circuit boards 12, and a metallic housing 14 fastened to the first insulating body 11.

The first insulating body 11 includes a first internal connecting portion 111 and a first external connecting portion 112 which are respectively arranged on two opposite sides thereof. The first internal connecting portion 111 and the first external connecting portion 112 are detachably buckled to each other. The first internal connecting portion 111 has an assembling segment 1111, a connecting segment 1112 extending from the assembling segment 1111, and two posts 1113 formed on the connecting segment 1112. Specifically, the assembling segment 1111 of the first internal connecting portion 111 has an inner fixing structure 1111a, an outer fixing structure 1111b, and a first assembling structure 1111c. The inner fixing structure 1111a is buckled to the first external connecting portion 112 for firmly connecting the first internal connecting portion 111 and the first external connecting portion 112. The outer fixing structure 1111b is buckled to the metallic housing 14, the external connecting portion 112 is approximately arranged in the metallic housing 14, and at least 50% of the volume of the internal connecting portion 111 is arranged outside the metallic housing 14. In particular, the portion of the internal connecting portion 111 which is exposed outside the metallic housing 14 has the connecting segment 1112 and the two posts 1113.

The first assembling structure 1111c is configured for detachably mounting on a first carrying surface (not shown). That is to say, the first adapter 1 in the present embodiment can be detachably mounted on any object (e.g., a server rack) according to a user's demand, and the first adapter 1 needs not to be soldered on a circuit board. For example, the first assembling structure 1111c can be provided with a screw wedged in the assembling segment 1111 of the first internal connecting portion 111, and the first adapter 1 can be fixed on any object by using the screw.

The connecting segment 1112 has a mating surface 1112a arranged away from the assembling segment 1111, and the first internal connecting portion 111 has two inserting slots 1112b recessed from the mating surface 1112a. Each of the posts 1113 is extended from the connecting segments 1112 in a direction away from the assembling segment 1111, and each of the posts 1113 at least partially protrudes from the mating surface 1112a for guiding a mating adapter in which the mating adapter in the present embodiment can be seen as a second adapter 2 of the second adapter assembly 20 and inserted into the two inserting slots 1112b of the first internal connecting portion 111.

Moreover, the first external connecting portion 112 has two inserting slots 1121 recessed from an end thereof away from the assembling segment 1111. The two inserting slots 1121 of the first external connecting portion 112 are respectively in air communication with the two inserting slots 1112b of the first internal connecting portion 111.

It should be noted that the first conductive modules 13 of the first adapter 1 in the present embodiment are eight identical structures, that is to say, each of the two surfaces of each circuit board 12 is provided with two of the first conductive modules 13 respectively disposed on two opposite ends thereof, but the present disclosure is not limited thereto.

Figure 6:
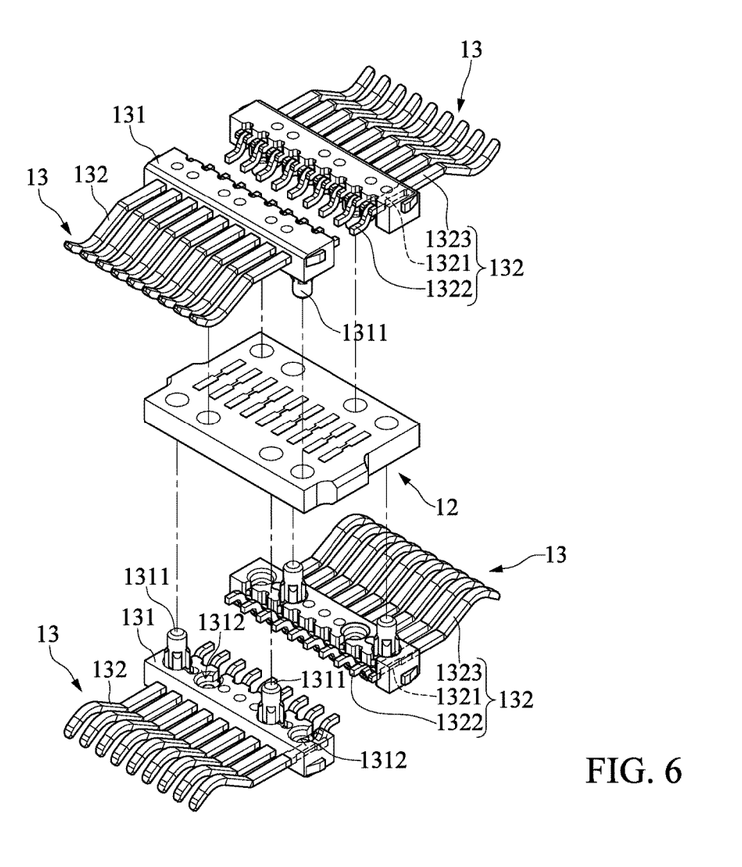
FIG. 6 is an exploded view showing a first conductive module and a circuit board of FIG. 4.

As shown in FIGS. 4 to 6, each of the first conductive modules 13 includes a first plastic member 131 and a plurality of first conductive terminals 132 arranged in one row. The first conductive terminals 132 in the present embodiment are substantially the same structure. Each of the first conductive terminals 132 has a first embedded segment 1321 embedded in the first plastic member 131, a first fixing segment 1322 extending from an end of the first embedded segment 1321, and a first contacting segment 1323 extending from an opposite end of the first embedded segment 1321.

In the first adapter 1, the first conductive terminals 132 are arranged in the first internal connecting portion 111 and the first external connecting portion 112 to respectively form the two first electrical connection interfaces. In other words, a part of the first conductive terminals 132 are connected to one side of the two circuit boards 12 to form one of the two first electrical connection interfaces, and the other part of the first conductive terminals 132 are connected to the other side of the two circuit boards 12 to form the other first electrical connection interface.

Specifically, the first fixing segments 1322 of the first conductive terminals 132 of the first conductive modules 13 are soldered on the two circuit boards 12 by using a surface mounting technology (SMT) manner. Also, the first contacting segments 1323 of the first conductive terminals 132 of the first conductive modules 13 are extended in two opposite directions away from the circuit boards 12 to respectively arrange in the two inserting slots 1112b of the first internal connecting portion 111 and the two inserting slots 1121 of the first external connecting portion 112, so that the first contacting segments 1323 are arranged in the first internal connecting portion 111 and the first external connecting portion 112 to respectively form the two first electrical connection interfaces.

Figure 7:
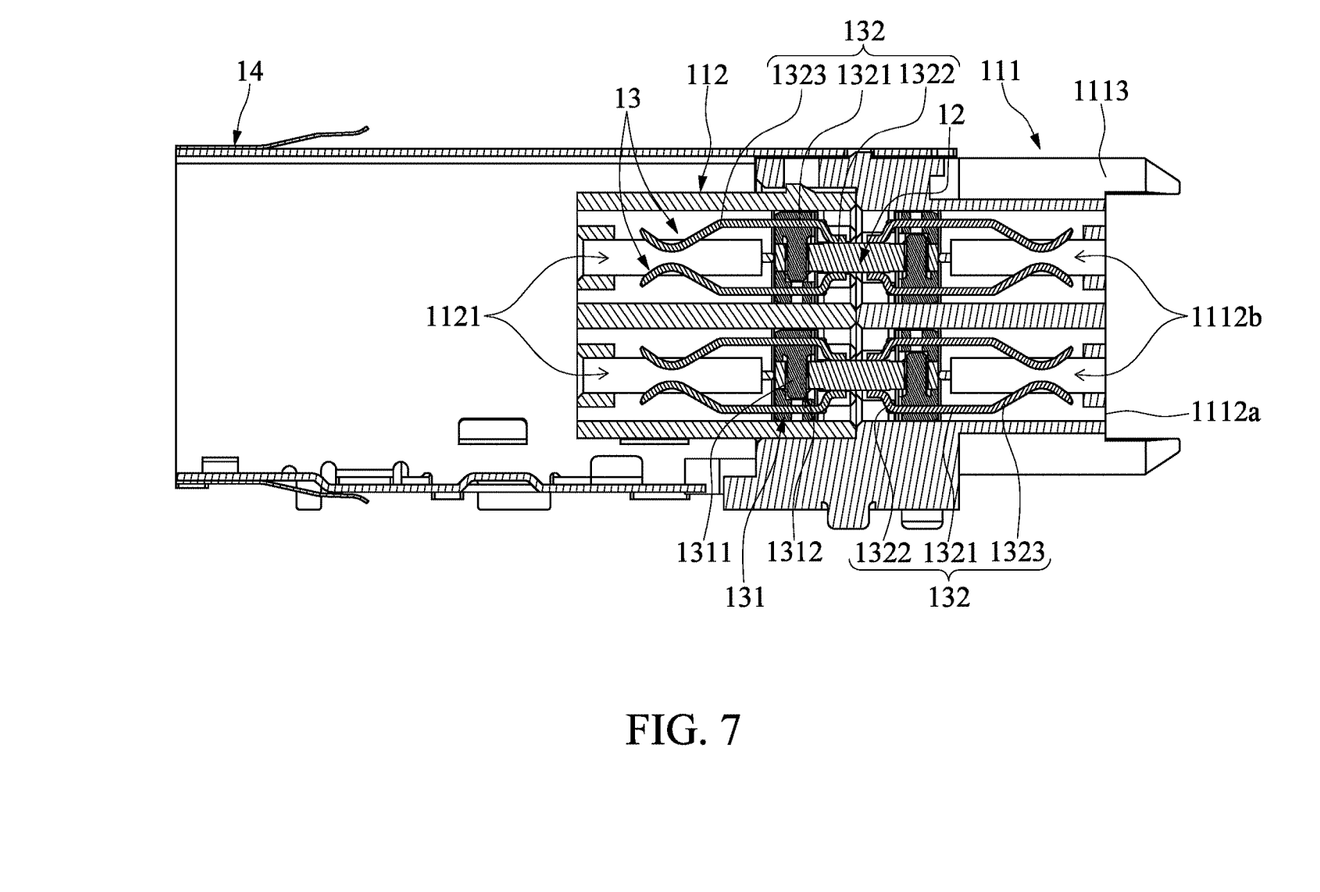
FIG. 7 is a cross-sectional view taken along a cross-sectional line VII-VII of FIG. 2.

Specifically, in two of the first conductive modules 13 which are disposed on the same surface of one of the circuit boards 12 (i.e., the upper first conductive modules 13 disposed on the top surface of the upper circuit board 12 as shown in FIG. 7), the first contacting segments 1323 of one of the two conductive modules 13 are respectively and electrically connected to the contacting segments 1323 of the other conductive module 13 through the one of the circuit boards 12. In other words, one of the two first electrical connection interfaces located at the first internal connecting portion 111 is electrically connected to the other first electrical connection interface located at the first external connecting portion 112 through the corresponding circuit board 12.

Moreover, each of the first external connecting portions 112 and the corresponding first electrical connection interface are configured for accommodating and electrically connecting to a cable connector (i.e., an external Mini-SAS HD cable connector), and each of the first internal connecting portions 111 and the corresponding first electrical connection interface are configured to accommodate and electrically connect to a mating adapter (i.e., the second adapter 2 of the second adapter assembly 20).

In two of the first conductive modules 13 which are adjacent to each other and are respectively disposed on the two opposite surfaces of one of the circuit boards 12 (i.e., the left first conductive modules 13 disposed on the upper circuit board 12 as shown in FIG. 7), the first plastic member 131 of one of the two adjacent first conductive modules 13 is detachably connected to the first plastic member 131 of the other first conductive module 13, and one end portion of the one of the circuit boards 12 is sandwiched between the two first plastic members 131. Specifically, each of the first plastic members 131 includes two positioning columns 1311 and two positioning slots 1312. The two positioning columns 1311 of the first plastic member 131 of one of the two adjacent first conductive modules 13 are respectively inserted into the two positioning slots 1312 of the first plastic member 131 of the other first conductive module 13 by passing through (or wedging in) the one of the circuit boards 12.

The structure of single first adapter 1 has been disclosed in the above description, and the following description discloses the relationship of the first adapters 1 of the first adapter assembly 10. The assembling segments 1111 of the first internal connecting portions 111 can be connected to (e.g., screwed to, welded to, soldered to, or buckled to) each other to form as one piece. In present embodiment, the assembling segments 1111 of the first internal connecting portions 111 are integrally formed as one piece, and the first external connecting portions 112 are respectively and detachably fastened to the inner fixing structures 1111a of the first internal connecting portions 111, but the present disclosure is not limited thereto.

For example, in other embodiments of the present disclosure, the first external connecting portions 112 can be connected to (e.g., screwed to, welded to, soldered to, buckled to, integrally formed with) each other to form as one piece, and the first internal connecting portions 111 are respectively and detachably fastened to the first external connecting portions 112. In addition, the first adapter assembly 10 may include at least one first assembling structure 1111c formed on at least one of the first insulating bodies 11.

Figure 8:
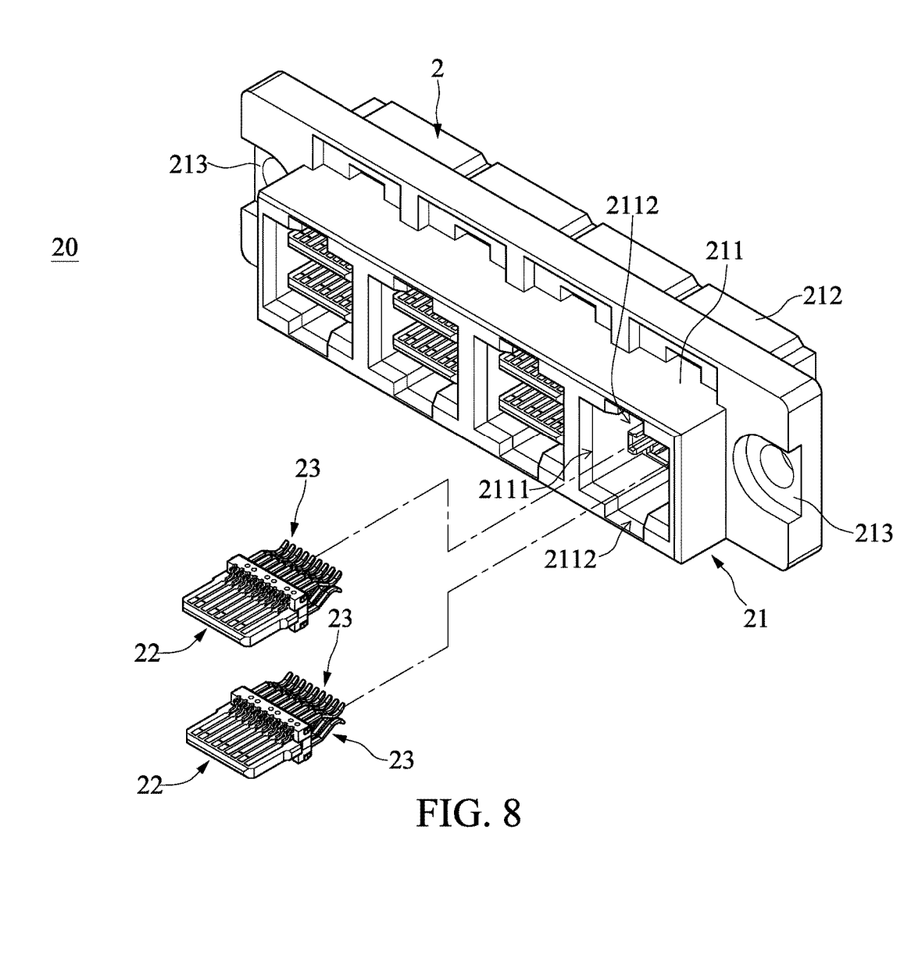
FIG. 8 is an exploded view showing a second adapter assembly of the embodiment.
Figure 9:
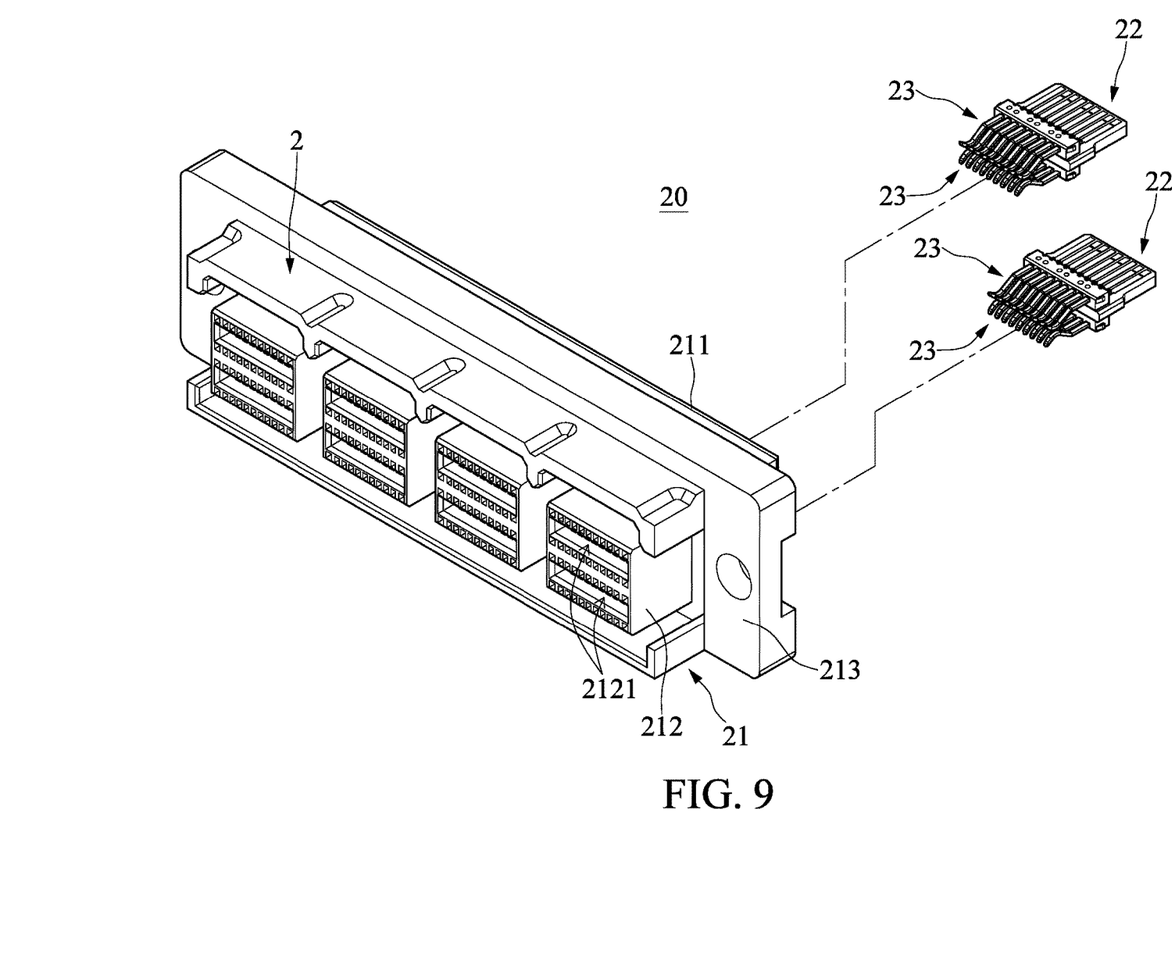
FIG. 9 is an exploded view showing the second adapter assembly of the embodiment from another perspective.

As shown in FIGS. 8 and 9, the second adapter assembly 20 includes a plurality of second adapters 2 arranged in one row. Each of the second adapters 2 has a first electrical connection interface and a second electrical connection interface respectively arranged on two opposite sides thereof, and the second electrical connection interface is different from the first electrical connection interface. That is to say, one side of the second adapter 2 and each side of the first adapter 1 have the same electrical connection interface. As the second adapters 2 are of the same structure, the following description only discloses the structure of one of the second adapters 2 for the sake of brevity.

The second adapter 2 includes a second insulating body 21, two tongue plates 22 separately arranged in the second insulating body 21, and a plurality of second conductive modules 23 arranged in the second insulating body 21 and respectively disposed on the two tongue plates 22.

The second insulating body 21 includes a second internal connecting portion 211 and a second external connecting portion 212 which are respectively arranged on two opposite sides thereof. The second internal connecting portion 211 and the second external connecting portion 212 in the present embodiment are integrally formed as one piece. The second internal connecting portion 211 has an inserting slot 2111 recessed from an end thereof and two guiding slots 2112 in air communication with the inserting slot 2111. The second external connecting portion 212 has two inserting slots 2121 recessed from an end thereof, and the two inserting slots 2121 are in air communication with the inserting slot 2111.

It should be noted that the second conductive modules 23 of the second adapter 2 in the present embodiment are four identical structures, that is to say, one end portion of each tongue plate 22 is provided with two of the second conductive modules 23 disposed on two opposite surfaces thereof, but the present disclosure is not limited thereto. Moreover, the second conductive module 23 in the present embodiment is substantially identical to the first conductive module 13, but the present disclosure is not limited thereto.

Figure 10:
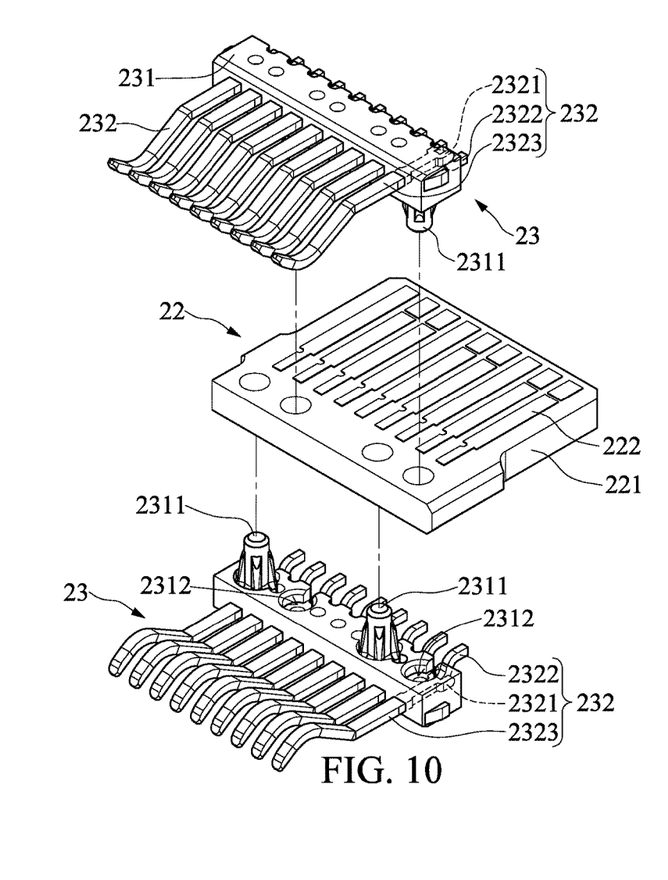
FIG. 10 is an exploded view showing a second conductive module and a tongue plate of FIG. 9.

As shown in FIG. 10, each of the second conductive modules 23 includes a second plastic member 231 and a plurality of second conductive terminals 232 arranged in one row. The second conductive terminals 232 in the present embodiment are substantially the same structure. Each of the second conductive terminals 232 has a second embedded segment 2321 embedded in the second plastic member 231, a second fixing segment 2322 extending from an end of the second embedded segment 2321, and a second contacting segment 2323 extending from an opposite end of the second embedded segment 2321.

Moreover, in the present embodiment, each of the tongue plates 22 includes a plate 221 and a plurality of terminals 222 formed on two opposite surfaces of the plate 221. The second fixing segments 2322 of the second conductive terminals 232 of the second conductive modules 23 are respectively soldered on the two tongue plates 22, thereby electrically connecting to the terminals 222 of the tongue plates 22. In addition, the terminals 222 in the present embodiment can be regarded as second conductive terminals 232.

In the second adapter 2, the second conductive terminals 232 (includes the terminals 222) are arranged in the second internal connecting portion 211 and the second external connecting portion 212 to respectively form the second electrical connection interface and the first electrical connection interface. In other words, the terminals 222 of the two tongue plates 22 are arranged to form the second electrical connection interface, and the second conductive terminals 232 of the second conductive modules 23 are arranged to form the first electrical connection interface. The second electrical connection interface located at the second internal connecting portion 211 is electrically connected to the first electrical connection interface located at the second external connecting portion 212.

Specifically, the two tongue plates 22 with the terminals 222 are separately arranged in the inserting slot 2111 of the second internal connecting portion 211, so that the second internal connecting portions 211 and the corresponding second electrical connection interfaces are configured to accommodate and electrically connect to a mating adapter (i.e., the first adapter 1). Moreover, the second conductive terminals 232 of the second conductive modules 23 are respectively arranged in the two inserting slots 2121 of the second external connecting portion 212, so that each of the second external connecting portions 212 and the corresponding first electrical connection interface are configured for accommodating and electrically connecting to a cable connector (i.e., an internal Mini-SAS HD cable connector).

Figure 11:
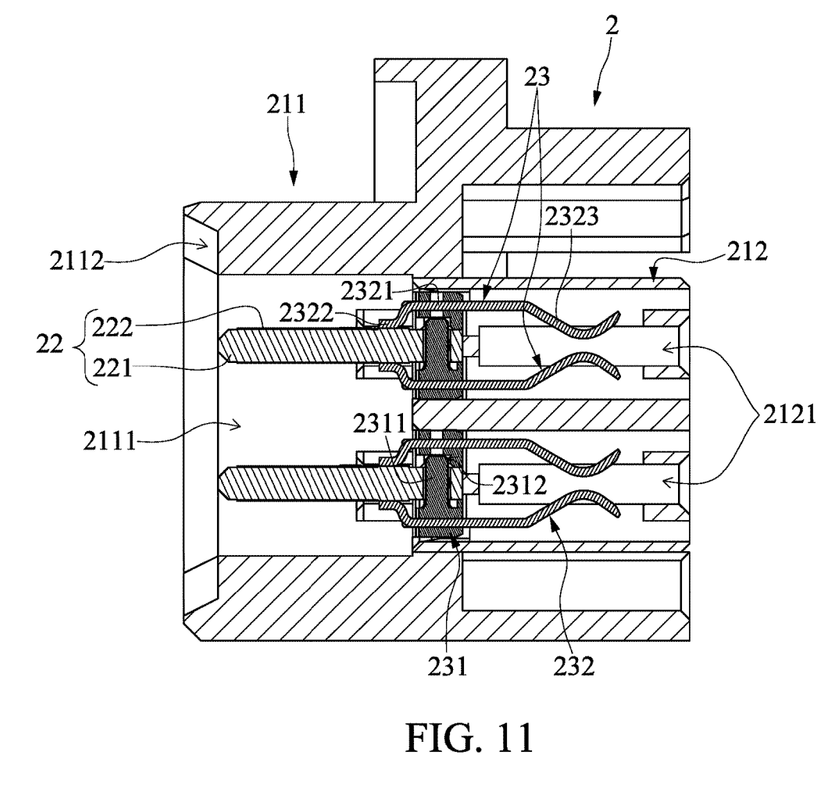
FIG. 11 is a cross-sectional view taken along a cross-sectional line XI-XI of FIG. 2.

In two of the second conductive modules 23 which are adjacent to each other and are disposed on the same tongue plate 22 (i.e., the two adjacent second conductive modules 23 disposed on the upper tongue plate 22 as shown in FIG. 11), the second plastic member 231 of one of the two adjacent second conductive modules 23 is detachably connected to the second plastic member 231 of the other second conductive module 23, and one end portion of the tongue plate 22 is sandwiched between the two second plastic members 231. Specifically, each of the second plastic members 231 includes two positioning columns 2311 and two positioning slots 2312. The two positioning columns 2311 of the second plastic member 231 of one of the two adjacent second conductive modules 23 are respectively inserted into the two positioning slots 2312 of the second plastic member 231 of the other second conductive module 23 by passing through (or wedging in) the tongue plate 22.

The structure of single second adapter 2 has been disclosed in the above description, and the following description discloses the relationship of the second adapters 2 of the second adapter assembly 20. The second insulating bodies 21 can be connected to (e.g., screwed to, welded to, soldered to, or buckled to) each other to form as one piece. In present embodiment, the second insulating bodies 21 are integrally formed as one piece. The second adapter assembly 20 includes two second assembling structures 213 respectively formed on two of the second insulating bodies 21 which are arranged at two opposite ends of the row of the insulating bodies 21, so that the second assembling structures 213 are configured for detachably mounting on a second carrying surface (not shown). That is to say, the second adapters 2 of the second adapter assembly 20 in the present embodiment can be detachably screwed on any object (e.g., a server rack) according to a user's demand by using the second assembling structures 213 (i.e., thru-holes), and the second adapters 2 of the second adapter assembly 20 need not to be soldered on a circuit board.

In summary, the first internal connecting portions 111 and the corresponding first electrical connection interfaces of the first adapter assembly 10 are respectively and detachably inserted into the second internal connecting portions 211 and the corresponding second electrical connection interfaces of the second adapter assembly 20, so that the first electrical connection interfaces of the first adapter assembly 10 located at the first external connecting portions 112 are respectively and electrically connected to the first electrical connection interfaces of the second adapter assembly 20 located at the second external connecting portions 212.

In each of the first adapters 1 and the inserted second adapter 2, the two posts 1113 of the first adapter 1 are respectively inserted into the two guiding slots 2112 of the second adapter 2, thereby guiding the two tongue plates 22 of the second adapter 2 to respectively insert into the two inserting slots 1112*b* of the first adapter 1. In addition, in other embodiments of the present disclosure, the first internal connecting portion 111 can be formed with a single post 1113, and the second internal connecting portion 211 is correspondingly formed with a single guiding slot 2112.

[The Effects of the Present Disclosure]

In view of the signal transferring device of the present disclosure, the first cable connectors can be respectively and electrically connected to the second cable connectors by inserting the first adapter assembly into the second adapter assembly. Accordingly, the first cable connectors can be electrically isolated from the second cable connectors by separating the first adapter assembly from the second adapter assembly, such that the first cable connectors and the second cable connectors can be still preserved into the first adapter assembly and the second adapter assembly, thereby preventing a repeated insertion endangering the cable connectors.

Moreover, the inner structure of each of the adapters is formed by soldering the conductive modules onto the circuit board, and each of the conductive modules is formed by the conductive terminals embedded in the plastic member through insert molding and soldered onto the circuit board through surface mounting technology (SMT), so that the adapter with lower production cost can be produced quickly.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. An adapter assembly, comprising a plurality of adapters arranged in one row, wherein each of the adapters includes:
    an insulating body including an internal connecting portion and an external connecting portion connected to the internal connecting portion;
    two circuit boards separately arranged in the insulating body; and
    a plurality of conductive modules arranged in the insulating body and respectively disposed on two opposite sides of the two circuit boards, wherein each of the conductive modules includes a plastic member and a plurality of conductive terminals arranged in one row, wherein each of the conductive terminals has an embedded segment embedded in the plastic member, a fixing segment extending from an end of the embedded segment, and a contacting segment extending from an opposite end of the embedded segment,
    wherein in each of the adapters, the fixing segments of the conductive modules are soldered on the two circuit boards by using a surface mounting technology (SMT) manner,
    wherein the internal connecting portions of the adapters are connected to each other to form as one piece.

2. The adapter assembly as claimed in claim 1, wherein each of the adapters has two electrical connection interfaces; in each of the adapters, the contacting segments are arranged in the internal connecting portion and the external connecting portion to respectively form the two electrical connection interfaces, and one of the two electrical connection interfaces located at the internal connecting portion is electrically connected to the other electrical connection interface located at the external connecting portion, wherein each of the internal connecting portions and the corresponding electrical connection interface are configured to accommodate and electrically connect to a mating adapter assembly, and each of the external connecting portions and the corresponding electrical connection interface are configured for accommodating and electrically connecting to a cable connector.

3. The adapter assembly as claimed in claim 1, wherein in each of the adapters, each of the two circuit boards has two opposite surfaces, and each of the surfaces is provided with two of the conductive modules disposed on two opposite ends thereof, wherein in two of the conductive modules arranged adjacent to each other and respectively disposed on the two opposite surfaces of one of the circuit boards, the plastic member of one of the two adjacent conductive modules is detachably connected to the plastic member of the other conductive module, wherein in two of the conductive modules disposed on the same surface of one of the circuit boards, the contacting segments of one of the two conductive modules are respectively and electrically connected to the contacting segments of the other conductive module through the one of the circuit boards.

4. The adapter assembly as claimed in claim 2, wherein in each of the adapters, each of the two circuit boards has two opposite surfaces, and each of the surfaces is provided with two of the conductive modules disposed on two opposite ends thereof, wherein in two of the conductive modules arranged adjacent to each other and respectively disposed on the two opposite surfaces of one of the circuit boards, the plastic member of one of the two adjacent conductive modules is detachably connected to the plastic member of the other conductive module, wherein in two of the conductive modules disposed on the same surface of one of the circuit boards, the contacting segments of one of the two conductive modules are respectively and electrically connected to the contacting segments of the other conductive module through the one of the circuit boards.

5. The adapter assembly as claimed in claim 1, wherein the internal connecting portions of the adapters are integrally formed as one piece, and the external connecting portions are respectively and detachably fastened to the internal connecting portions.

6. The adapter assembly as claimed in claim 2, wherein the internal connecting portions of the adapters are integrally formed as one piece, and the external connecting portions are respectively and detachably fastened to the internal connecting portions.

7. The adapter assembly as claimed in claim 3, wherein in two of the conductive modules arranged adjacent to each other and respectively disposed on the two opposite surfaces of one of the circuit boards, the plastic member of one of the two adjacent conductive modules includes a positioning slot, and the plastic member of the other conductive module includes a positioning column inserted into the positioning slot by passing through the one of the circuit boards.

8. The adapter assembly as claimed in claim 4, wherein in two of the conductive modules arranged adjacent to each other and respectively disposed on the two opposite surfaces of one of the circuit boards, the plastic member of one of the two adjacent conductive modules includes a positioning slot, and the plastic member of the other conductive module includes a positioning column inserted into the positioning slot by passing through the one of the circuit boards.

9. The adapter assembly as claimed in claim 1, wherein at least one of the insulating bodies of the adapter assembly includes an assembling structure for detachably mounting on a carrying surface.

10. An adapter, comprising:
an insulating body;
a circuit board arranged in the insulating body and having two opposite surfaces; and
a plurality of conductive modules arranged in the insulating body and respectively disposed on two opposite ends of at least one of the two surfaces of the circuit board, wherein each of the conductive modules includes a plastic member and a plurality of conductive terminals arranged in one row, wherein each of the conductive terminals has an embedded segment embedded in the plastic member, a fixing segment extending from an end of the embedded segment and soldered on the circuit board by using a surface mounting technology (SMT) manner, and a contacting segment extending from an opposite end of the embedded segment in a direction away from the circuit board.

11. The adapter as claimed in claim 10, wherein the insulating body includes an internal connecting portion and an external connecting portion detachably buckled to the internal connecting portion, and the contacting segments are arranged in the internal connecting portion and the external connecting portion.

12. The adapter as claimed in claim 11, wherein the internal connecting portion includes a mating surface and a post at least partially protruding from the mating surface, and the post of the adapter guides a corresponding adapter to insert into the internal connecting portion.

13. The adapter as claimed in claim 11, further comprising a metallic housing fastened to the insulating body, wherein the external connecting portion is arranged in the metallic housing, and at least 50% of volume of the internal connecting portion is arranged outside the metallic housing.

14. The adapter as claimed in claim 10, wherein each of the two surfaces of the circuit board is provided with two of the conductive modules disposed on two opposite ends thereof, wherein in two of the conductive modules arranged adjacent to each other and respectively disposed on the two opposite surfaces of the circuit board, the plastic member of one of the two adjacent conductive modules is detachably connected to the plastic member of the other conductive module, wherein in two of the conductive modules disposed on the same surface of the circuit board, the contacting segments of one of the two conductive modules are respectively and electrically connected to the contacting segments of the other conductive module through the circuit board.

15. The adapter as claimed in claim 14, wherein in two of the conductive modules arranged adjacent to each other and respectively disposed on the two surfaces of the circuit board, the plastic member of one of the two adjacent conductive modules includes a positioning slot, and the plastic member of the other conductive module includes a positioning column inserted into the positioning slot by passing through the circuit board.

16. The adapter as claimed in claim 10, wherein the insulating body includes an assembling structure for detachably mounting on a carrying surface.

* * * * *